(12) United States Patent
Hong et al.

(10) Patent No.: US 6,688,472 B2
(45) Date of Patent: Feb. 10, 2004

(54) CONTAINER FOR ELECTRIC DEVICE

(75) Inventors: Tung Teck Hong, Singapore (SG); Hideto Aoki, Singapore (SG)

(73) Assignees: Sumitomo Bakelite Company Limited, Tokyo (JP); Sumicarrier Singapore Pte. Ltd., Singapore (SG)

( * ) Notice: Subject to any disclaimer, the term of this patent is extended or adjusted under 35 U.S.C. 154(b) by 0 days.

(21) Appl. No.: 10/033,796

(22) Filed: Jan. 3, 2002

(65) Prior Publication Data

US 2002/0092794 A1 Jul. 18, 2002

(30) Foreign Application Priority Data

Jan. 16, 2001 (SG) ..................................... 200100232-8

(51) Int. Cl.[7] ............................................... B65D 85/90
(52) U.S. Cl. ........................ 206/714; 206/724; 206/725
(58) Field of Search ................................ 206/713, 714, 206/724, 725, 726

(56) References Cited

U.S. PATENT DOCUMENTS

| | | | | |
|---|---|---|---|---|
| 5,265,723 A | * | 11/1993 | Chenoweth et al. | 206/714 |
| 5,499,717 A | * | 3/1996 | Hayashi | 206/701 |
| 5,988,394 A | * | 11/1999 | Emoto et al. | 206/724 |

* cited by examiner

*Primary Examiner*—David T. Fidei
(74) *Attorney, Agent, or Firm*—Smith, Gambrell & Russell

(57) ABSTRACT

A container for receiving an electric device in a recess. The container includes a pair of projections for restraining a movement of the electric device in a first direction perpendicular to a second direction and directed from a top opening area of the recess toward a bottom area of the recess. The pair of projections have respective support surfaces facing to each other in the first direction. A distance between the support surfaces of the pair in the first direction decreases in the second direction in such a manner that each of the support surfaces contacts simultaneously the electric device to prevent the electric device from moving in the first direction.

36 Claims, 2 Drawing Sheets

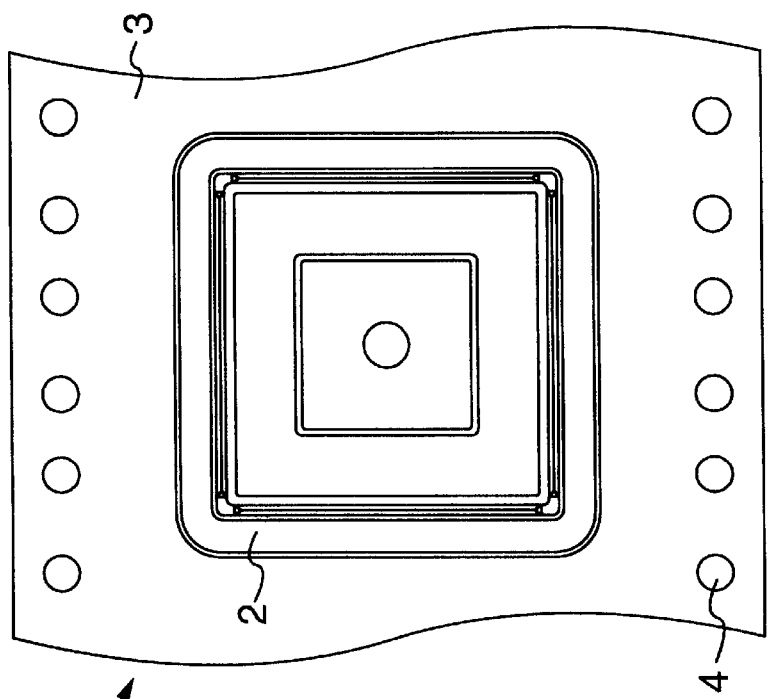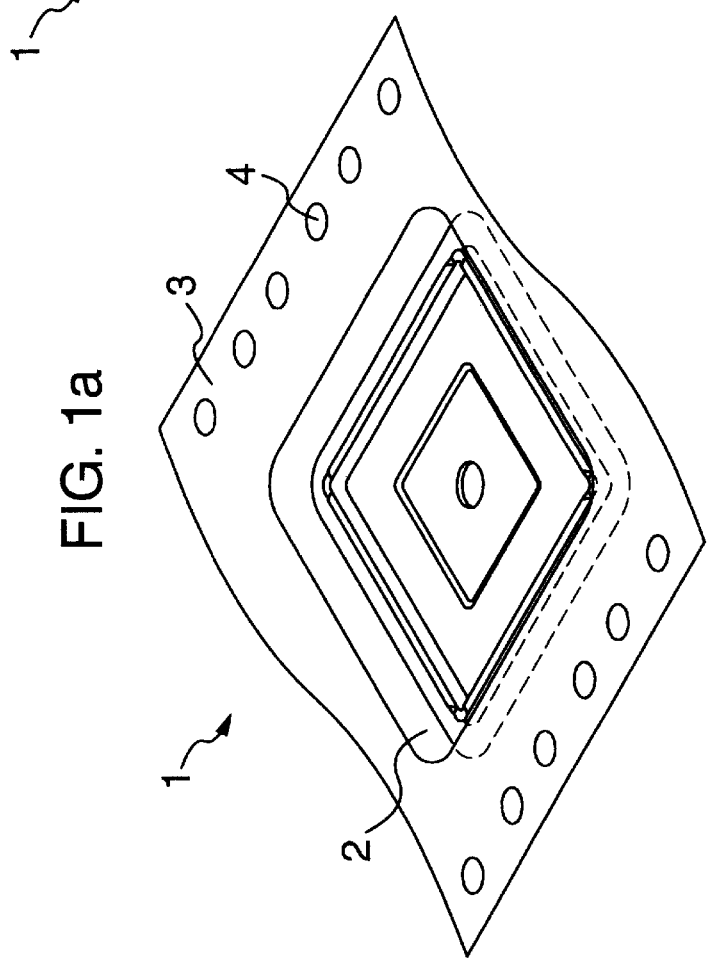

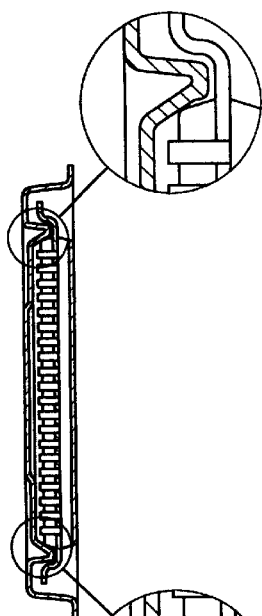
FIG. 2c
FIG. 2a
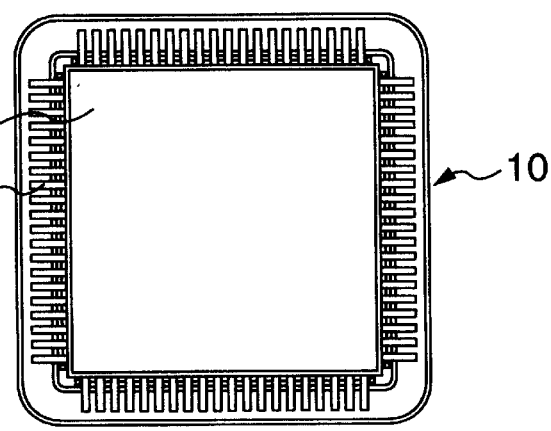
FIG. 2b
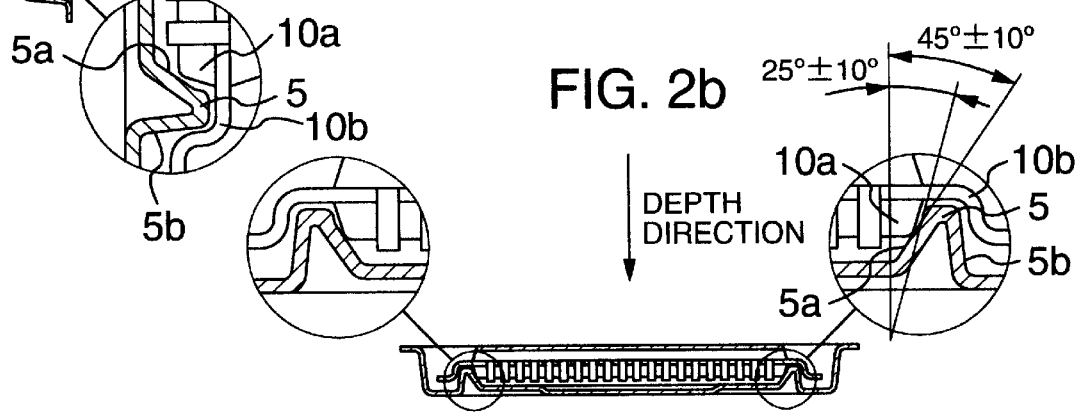

CONTAINER FOR ELECTRIC DEVICE

BACKGROUND OF THE INVENTION AND RELATED ART STATEMENT

The present invention relates to a container for receiving therein an electric device having at least two leads, particularly usable as a thermoplastic resin tape-shaped carrier container having recesses for containing respectively electric devices such as integrated circuit chips.

In the prior art, a recess of a container for containing an electric device has a pair of projections projecting from a bottom of the recess to restrain a movement of the electric device in the recess.

OBJECT AND SUMMARY OF THE INVENTION

An object of the present invention is to provide a container for receiving therein an electric device, by which container the electric device is stably and correctly held on the container.

According to the present invention, a container for receiving therein an electric device including a body in which an electric circuit or element such as semiconductor element, capacitor element, resister element, electrically connecting wire, micro-processor or the like is contained, and at least two leads projecting from the body and connected electrically to the electric circuit or element, comprises, a recess for receiving therein the electric device, including a bottom area and a top opening area for insertion of the electric device through the top opening area into the recess, and a pair of projections for restraining a movement of the electric device in a first direction perpendicular to a second direction directed from the top opening area toward the bottom area, wherein the projections of the pair have respective support surfaces facing to each other in the first direction, and a distance between the support surfaces of the pair in the first direction decreases in the second direction in such a manner that each of the support surfaces contacts simultaneously the electric device to prevent the electric device from moving in the first direction.

Since the distance between the support surfaces of the pair facing to each other in the first direction decreases gradually in the second direction or the support surfaces of the pair facing to each other in the first direction are tapered in the second direction in such a manner that each of the support surfaces simultaneously contacts the electric device, that is, one of the support surfaces contacts the electric device while or simultaneously with that another one of the support surfaces contacts the electric device, to prevent the electric device from moving in the first direction, the electric device is stably and correctly held and positioned between the tapered support surfaces of the pair without requiring an accurate dimensional control of a shape of the recess. As a matter of course, an upper distance between the support surfaces of the pair is larger than a width of portions of the electric device to be contacted respectively with the support surfaces, and a lower distance between the support surfaces of the pair is smaller than the width of the portions of the electric device to be contacted respectively with the support surfaces.

If the support surfaces of the pair are formed in such a manner that each of the support surfaces of the pair simultaneously contact the body of the electric device, and the support surfaces of the pair are prevented from contacting the leads, an excessive stress or strain of the leads is prevented while the electric device is stably and correctly held between the support surfaces of the pair. It is preferable for preventing the excessive stress or strain of the leads that the projections of the pair are formed in such a manner that the projections of the pair are prevented from contacting the leads when the electric device is prevented by the support surfaces of the pair from moving in the first direction.

It is preferable that the container further comprises another pair of projections for restraining the movement of the electric device in a third direction perpendicular to the second direction and different from the first direction, and the projections of the another pair have respective support surfaces facing to each other in the third direction so that the movement of the electric device in the third direction is limited between the support surfaces of the another pair each of which faces to the electric device in the third direction. It is preferable for preventing an excessive stress or strain of the electric device that the support surfaces of the another pair are formed in such a manner that a clearance is formed between the electric device and at least one of the support surfaces of the another pair in the third direction when the movement of the electric device in the third direction is limited between the support surfaces of the another pair. A distance between the support surfaces of the another pair in the third direction may decrease gradually in the second direction.

It is preferable for preventing the excessive stress or strain of the leads that the support surfaces of the another pair are formed in such a manner that the support surfaces of the another pair are prevented from contacting the leads when one of the support surfaces of the another pair is allowed to contact the body of the electric device so that the movement of the electric device is limited in the third direction, and/or that the projections of the another pair are formed in such a manner that the projections of the another pair are prevented from contacting the leads when the movement of the electric device in the third direction is limited between the support surfaces of the another pair.

It is preferable that rigidities of the support surfaces of the pair and the support surfaces of the another pair are sufficient small for allowing each of the support surfaces of the pair and each of the support surfaces of the another pair to simultaneously contact the electric device so that the electric device is restrained from moving in the first and third directions. If the support surfaces of the pair are tapered in the second direction so that each of the support surfaces of the pair simultaneously contacts an outer peripheral corner of the body to bear a weight of the electric device and to prevent the electric device from moving in the first direction, a damage of the leads, that is, the excessive strain and stress of the lead is securely prevented, and an accurate dimensional control of a shape of outer surface areas of the body to be contacted with the support surfaces is not necessary.

If the projections of the pair may have respective reverse surfaces being opposite to each other in the first direction and extending in the second direction as reverse surfaces relative to the support surfaces of the pair, it is preferable for preventing the excessive strain and stress of the lead that the projections of the pair are formed in such a manner that at least one of the reverse surfaces is prevented from contacting the lead when the support surfaces simultaneously contacts the electric device to prevent the electric device from moving in the first direction.

An angle between the second direction and one of the support surfaces or each of the support surfaces decreases in a fourth direction directed from the bottom area toward the top opening area, that is, in a direction opposite to the second direction.

One of the support surfaces facing to each other in the first direction may extend substantially parallel to the depth direction while another one of the support surfaces extend obliquely to the depth direction to form the tapered support surfaces facing to each other in the first direction.

BRIEF DESCRIPTION OF THE DRAWINGS

FIG. 1a is an oblique projection view showing a container (element carrier tape) of the invention.

FIG. 1b is a side view showing the container.

FIG. 1c is a cross sectional view showing the container.

FIG. 2a is a front view showing a recess of the container receiving therein an electric device.

FIG. 2b is a partially cross sectional view showing the electric device positioned in a first direction in the container.

FIG. 2c is a partially cross sectional view showing the electric device positioned in another direction perpendicular to the first direction in the container.

DETAILED DESCRIPTION OF PREFERRED EMBODIMENTS

As shown in FIG. 1, a container 1 used as a carrier tape for an electric device 10 such as SOP (small outline package), SSOP (shrink small outline package), TSOP (thin small outline package), TSSOP (thin shrink small outline package), PLCC (plastic leaded chip carrier), QFP (quad flat package), BGA (ball grid allay) or the like and made of a flexible resin has recesses (embossed areas) 2, and a flange 3. The electric device 10 includes a body 10a in which an electric circuit or element (not shown) is contained and which is made of a synthetic resin, a ceramic, a metallic material or the like, and at least two metallic leads 10b projecting from the body and connected electrically to the electric circuit. The recesses 2 are aligned along a longitudinal direction of the carrier tape with a constant interval and can receive therein respective electric devices. A tape-shaped cover (not shown) is adhered to the flange 3 to cover the recesses so that the electric elements are prevented from being removed from the recesses, and tape feeding holes 4 are arranged along the longitudinal direction at at least one of sides of the flanges. The recesses 2 are formed by urging pneumatically (with pressure difference by vacuuming or pressurizing air) parts of a thermoplastic resin sheet into respective cavities of a mold.

Each of the recesses 2 has two pair of projections 5. Inclined or tapered support surfaces 5a of the corresponding projections 5 of one of the two pairs face to each other in the longitudinal direction of the carrier tape, and the inclined or tapered support surfaces 5a of the corresponding projections 5 of another one of the two pairs face to each other in a direction perpendicular to the longitudinal direction of the carrier tape.

In each of the recesses 2, the inclined or tapered shape of the support surfaces 5a of each of the pairs is formed in such a manner that a distance between the support surfaces 5a of the each of the pair decreases gradually in a depth direction directed toward a bottom area of the recess 2 from a top opening area for insertion of the electric device 10 into the recess 2 in such a manner that each of the support surfaces 5a of one of the pairs or each of the pairs simultaneously contacts the electric device 10 to prevent the electric device 10 from moving in the longitudinal direction and/or the direction perpendicular to the longitudinal direction.

The support surfaces 5a of the pair are formed in such a manner that each of the support surfaces 5a of the pair simultaneously contact the body 10a of the electric device 10, and the support surfaces 5a of the pair are prevented from contacting the leads 10b. The projections 5 of the pair or of the pairs are formed in such a manner that the projections 5 of the pair or of the pairs are prevented from contacting the leads 10b when the electric device 10 is prevented by the support surfaces 5a of the pair or of the pairs from moving in the longitudinal direction and/or the direction perpendicular to the longitudinal direction.

The movement of the electric device 10 in one of the longitudinal direction and the direction perpendicular to the longitudinal direction may limited between the support surfaces 5a of one of the pairs with a clearance between the electric device 10 and at least one of the support surfaces 5a of the one of the pairs when the movement of the electric device 10 in another one of the longitudinal direction and the direction perpendicular to the longitudinal direction is prevented between the support surfaces 5a of the another one of the pairs.

The support surfaces 5a of one of the pairs may be formed in such a manner that the support surfaces 5a of the one of the pairs are prevented from contacting the leads 10b while one of the support surfaces 5a of the one of the pairs is allowed to contact the body 10a of the electric device 10 so that the movement of the electric device 10 is limited in one of the longitudinal direction and the direction perpendicular to the longitudinal direction.

The support surfaces 5a of at least one of the pairs are tapered in the depth direction so that each of the support surfaces of the at least one of pairs simultaneously contacts an outer peripheral corner of the body 10a to bear a weight of the electric device 10 and to prevent the electric device 10 from moving in the longitudinal direction and/or the direction perpendicular to the longitudinal direction.

Rigidities of the support surfaces 5a of the pairs are decreased by a shell structure of the projections 5 and/or a low rigidity of a plastic material forming the projections to be sufficient small for allowing each of the support surfaces 5a of the pairs to simultaneously contact the electric device 10 so that the electric device 10 is restrained from moving in the longitudinal direction and the direction perpendicular to the longitudinal direction.

Reverse surfaces 5b of the projections 5 opposite to each other in each of the longitudinal direction and the direction perpendicular to the longitudinal direction and extending in the depth direction are prevented from contacting the leads 10b when the support surfaces 5a of at least one of the pairs simultaneously contacts the electric device 10 to prevent the electric device 10 from moving in the longitudinal direction and/or the direction perpendicular to the longitudinal direction.

An angle between each of the support surfaces 5a and the depth direction is preferably 45 degrees with an tolerance of ±10 degrees. Each of the support surfaces 5a may be bent to form a pair of an upper support surface area relatively near to the top opening area and a lower support surface relatively near to the bottom area. An angle (preferably 45 degrees with an tolerance of ±10 degrees) between the lower support surface area and the depth direction is larger than an angle (preferably 25 degrees with an tolerance of ±10 degrees) between the upper support surface area and the depth direction. It is preferable that the outer peripheral corner of the body 10a contacts the lower support surface area to position the electric device 10.

What is claimed is:

1. A container for receiving therein an electric device including a body in which an electric element is contained, and at least two leads projecting from the body and connected electrically to the electric element, wherein the body has a bottom surface, a pair of side surfaces opposite to each other, and a pair of corners each of which is formed between the bottom surface and respective one of the side surfaces, comprising:

a recess for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area, wherein the projections of the pair have respective support surfaces facing to each other in the first direction so that the support surfaces face to the side surfaces respectively in the first direction, a distance between the support surfaces of the pair in the first direction decreases in the second direction in such a manner that each of the support surfaces simultaneously contacts respective one of the side surfaces of the electric device to prevent the electric device from moving in the first direction, and an angle between the support surfaces facing respectively to the side surfaces is larger than an angle between the side surfaces so that the body contacts the support surfaces through the corners.

2. The container according to claim 1, wherein the support surfaces of the pair are formed in such a manner that each of the support surfaces of the pair simultaneously contact the body of the electric device, and the support surfaces of the pair are prevented from contacting the leads.

3. The container according to claim 1, wherein the projections of the pair are formed in such a manner that the projections of the pair are prevented from contacting the leads when the electric device is prevented by the support surfaces of the pair from moving in the first direction.

4. The container according to claim 1, further comprising another pair of projections for restraining the movement of the electric device in a third direction perpendicular to the second direction and different from the first direction, wherein the projections of the another pair have respective support surfaces facing to each other in the third direction so that the movement of the electric device in the third direction is limited between the support surfaces of the another pair each of which faces to the electric device in the third direction.

5. A container for receiving therein an electric device, comprising:

a recess for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area; and another pair of projections for restraining the movement of the electric device in a third direction perpendicular to the second direction and different from the first direction, wherein the projections of the another pair have respective support surfaces facing to each other in the third direction so that the movement of the electric device in the third direction is limited between the support surfaces of the another pair each of which faces to the electric device in the third direction, wherein the projections of the pair have respective support surfaces facing to each other in the first direction, and a distance between the support surfaces of the pair in the first direction decreases in the second direction in such a manner that each of the support surfaces simultaneously contacts the electric device to prevent the electric device from moving in the first direction, and wherein the support surfaces of the another pair are formed in such a manner that a clearance is formed between the electric device and at least one of the support surfaces of the another pair in the third direction when the movement of the electric device in the third direction is limited between the support surfaces of the another pair.

6. The container according to claim 4, wherein a distance between the support surfaces of the another pair in the third direction decreases in the second direction.

7. The container according to claim 4, wherein the support surfaces of the another pair are formed in such a manner that the support surfaces of the another pair are prevented from contacting the leads and one of the support surfaces of the another pair is allowed to contact the body of the electric device so that the movement of the electric device is limited in the third direction.

8. The container according to claim 4, wherein the projections of the another pair are formed in such a manner that the projections of the another pair are prevented from contacting the leads when the movement of the electric device in the third direction is limited between the support surfaces of the another pair.

9. The container according to claim 4, wherein rigidities of the support surfaces of the pair and the support surfaces of the another pair are sufficient small for allowing each of the support surfaces of the pair and each of the support surfaces of the another pair to simultaneously contact the electric device so that the electric device is prevented from moving in the first and third directions.

10. The container according to claim 1, wherein the support surfaces of the pair are tapered in the second direction so that each of the support surfaces of the pair simultaneously contacts an outer peripheral corner of the body to bear a weight of the electric device and to prevent the electric device from moving in the first direction.

11. The container according to claim 1, wherein the projections of the pair have respective reverse surfaces being opposite to each other in the first direction and extending in the second direction as reverse surfaces relative to the support surfaces of the pair, and the projections of the pair are formed in such a manner that at least one of the reverse surfaces is prevented from contacting the leads when the support surfaces simultaneously contacts the electric device to prevent the electric device from moving in the first direction.

12. A container for receiving therein an electric device, comprising:

a recess for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area, wherein the projections of the pair have respective support surfaces facing to each other in the first direction, and a distance between the support surfaces of the pair in the first direction decreases in the second direction in such a manner that each of the support surfaces simultaneously contacts the electric device to prevent the electric device from moving in the first direction, and wherein an angle between the second direction and one of the support surfaces decreases in a fourth direction from the bottom area toward the top opening area.

13. A container having retained therein an electric device employing an electric element with a body and at least two electrical leads projecting from the body, wherein the body has a bottom surface, a pair of side surfaces opposite to each other, and a pair of corners each of which is formed between the bottom surface and respective one of the side surfaces said container comprising:

a recess for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area, wherein the projections of the pair have respective support surfaces facing to each other in the first direction so that the support surfaces face to the side surfaces respectively in the first direction, a distance between the support surfaces of the pair in the first direction decreases in the second direction in such a manner that each of the support surfaces simultaneously contacts respective one of the side surfaces of the electric device to prevent the electric device from moving in the first direction, and an angle between the support surfaces facing respectively to the side surfaces is larger than an angle between the side surfaces so that the body contacts the support surfaces through the corners.

14. The container according to claim 13, wherein the support surfaces of the pair are formed in such a manner that each of the support surfaces of the pair simultaneously contact the body of the electric device, and the support surfaces of the pair are prevented from contacting the leads.

15. The container according to claim 13, wherein the projections of the pair are formed in such a manner that the projections of the pair are prevented from contacting the leads when the electric device is prevented by the support surfaces of the pair from moving in the first direction.

16. The container according to claim 13, further comprising another pair of projections for restraining the movement of the electric device in a third direction perpendicular to the second direction and different from the first direction, wherein the projections of the another pair have respective support surfaces facing to each other in the third direction so that the movement of the electric device in the third direction is limited between the support surfaces of the another pair each of which faces to the electric device in the third direction.

17. A container having retained therein an electric device employing an electric element with a body and at least two electrical leads projecting from the body, said container comprising:

a recess for receiving therein the electric device, including a top opening area for insertion of the electric device therethrough into the recess, and a bottom area;

a first pair of projections for restraining a movement of the electric device in a first direction perpendicular to a second direction directed from the top opening area toward the bottom area; and a second pair of projections for restraining the movement of the electric device in a third direction perpendicular to the second direction and different from the first direction, wherein the second pair of projections have respective support surfaces facing to each other in the third direction so that the movement of the electric device in the third direction is limited between the support surfaces of the second pair of projections each of which faces to the electric device in the third direction, wherein the first pair of projections have respective support surfaces facing to each other in the first direction, and a distance between the support surfaces of the first pair of projections in the first direction decreases in the second direction in such a manner that each of the support surfaces simultaneously contacts the electric device to prevent the electric device from moving in the first direction, and wherein the support surfaces of the second pair of projections are formed in such a manner that a clearance is formed between the electric device and at least one of the support surfaces of the second pair of projections in the third direction when the movement of the electric device in the third direction is limited between the support surfaces of the another pair.

18. The container according to claim 16, wherein a distance between the support surfaces of the second pair of projections in the third direction decreases in the second direction.

19. The container according to claim 16, wherein the support surfaces of the second pair of projections are formed in such a manner that the support surfaces of the second pair of projections are prevented from contacting the leads and one of the support surfaces of the second pair of projections is allowed to contact the body of the electric device so that the movement of the electric device is limited in the third direction.

20. The container according to claim 16, wherein the projections of the second pair of projections are formed in such a manner that the second pair of projections are prevented from contacting the leads when the movement of the electric device in the third direction is limited between the support surfaces of the second pair of projections.

21. The container according to claim 16, wherein rigidities of the support surfaces of the first pair of projections and the support surfaces of the second pair of projections are sufficient small for allowing each of the support surfaces of the first pair of projections and each of the support surfaces of the second pair of projections to simultaneously contact the electric device so that the electric device is prevented from moving in the first and third directions.

22. The container according to claim 13, wherein the support surfaces of the pair are tapered in the second direction so that each of the support surfaces of the pair simultaneously contacts an outer peripheral corner of the body to bear a weight of the electric device and to prevent the electric device from moving in the first direction.

23. The container according to claim 13, wherein the projections of the pair have respective reverse surfaces being opposite to each other in the first direction and extending in the second direction as reverse surfaces relative to the support surfaces of the pair, and the projections of the pair are formed in such a manner that at least one of the reverse surfaces is prevented from contacting the leads when the support surfaces simultaneously contacts the electric device to prevent the electric device from moving in the first direction.

24. A container having retained therein an electric device employing an electric element with a body and at least two electrical leads projecting from the body, said container comprising:

a recess for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area, wherein the projections of the pair have respective support surfaces facing to each other in the first direction, and a distance between the support surfaces of the pair in the first direction decreases in the second direction in such a manner that each of the support surfaces simultaneously contacts the electric device to prevent the electric device from moving in the first direction, and wherein an angle between the second direction and one of the support surfaces decreases in a fourth direction from the bottom area toward the top opening area.

25. A thermoplastic resin tape-shaped carrier container for containing electric devices, each of the electric devices including a body in which an electric element is contained, and at least two leads projecting from the body and connected electrically to the electric element, wherein the body has a bottom surface, a pair of side surfaces opposite to each other, and a pair of corners each of which is formed between the bottom surface and respective one of the side surfaces, comprising:

a plurality of recesses for receiving therein the electric devices, each of the recesses including a top opening area for insertion of the electric device therethrough into the recess, and a bottom area; and pairs of projections for restraining a movements of the electric devices in a first direction perpendicular to a second direction directed from the top opening area toward the bottom area, wherein the projections of each of the pairs have respective support surfaces facing to each other in the first direction so that the support surfaces of each of the pairs face to respectively the side surfaces of the respective one of the electric devices in the first direction, a distance between the support surfaces of each of the pairs in the first direction decreases in the second direction in such a manner that the support surfaces of each of the pairs simultaneously contacts respectively the side surfaces of respective one of the electric devices to prevent the electric devices from moving in the first direction, and an angle between the support surfaces of each of the pairs facing respectively to the side surfaces of respective one of the electric devices is larger than an angle between the side surfaces of the respective one of the electric devices so that each of the bodies contacts the support surfaces through the corners.

26. The container according to claim 25, wherein the support surfaces of the pair are formed in such a manner that each of the support surfaces of the pair simultaneously contact the body of the electric device, and the support surfaces of the pair are prevented from contacting the leads.

27. The container according to claim 25, wherein the projections of the pair are formed in such a manner that the projections of the pair are prevented from contacting the leads when the electric device is prevented by the support surfaces of the pair from moving in the first direction.

28. The container according to claim 25, further comprising another pair of projections for restraining the movement of the electric device in a third direction perpendicular to the second direction and different from the first direction, wherein the projections of the another pair have respective support surfaces facing to each other in the third direction so that the movement of the electric device in the third direction is limited between the support surfaces of the another pair each of which faces to the electric device in the third direction.

29. A thermoplastic resin tape-shaped carrier container for containing electric devices, comprising:

a plurality of recesses for receiving therein the electric device, including a top opening area for insertion of the electric device therethrough into the recess, and a bottom area;

a first pair of projections for restraining a movement of the electric device in a first direction perpendicular to a second direction directed from the top opening area toward the bottom area;

a second pair of projections for restraining the movement of the electric device in a third direction perpendicular to the second direction and different from the first direction, wherein the second pair of projections have respective support surfaces facing to each other in the third direction so that the movement of the electric device in the third direction is limited between the support surfaces of the second pair of projections each of which faces to the electric device in the third direction;

wherein the first pair of projections have respective support surfaces facing to each other in the first direction, and a distance between the support surfaces of the first pair of projections in the first direction decreases in the second direction in such a manner that each of the support surfaces simultaneously contacts the electric device to prevent the electric device from moving in the first direction, and wherein the support surfaces of the second pair of projections are formed in such a manner that a clearance is formed between the electric device and at least one of the support surfaces of the second pair of projections in the third direction when the movement of the electric device in the third direction is limited between the support surfaces of the second pair of projections.

30. The container according to claim 28, wherein a distance between the support surfaces of the second pair of projections in the third direction decreases in the second direction.

31. The container according to claim 28, wherein the support surfaces of the second pair of projections are formed in such a manner that the support surfaces of the second pair of projections are prevented from contacting the leads and one of the support surfaces of the second pair of projections is allowed to contact the body of the electric device so that the movement of the electric device is limited in the third direction.

32. The container according to claim 28, wherein the projections of the second pair of projections are formed in such a manner that the second pair of projections are prevented from contacting the leads when the movement of the electric device in the third direction is limited between the support surfaces of the second pair of projections.

33. The container according to claim 28, wherein rigidities of the support surfaces of the first pair of projections and the support surfaces of the second pair of projections are sufficient small for allowing each of the support surfaces of the first pair of projections and each of the support surfaces of the second pair of projections to simultaneously contact the electric device so that the electric device is prevented from moving in the first and third directions.

34. The container according to claim 25, wherein the support surfaces of the pair are tapered in the second direction so that each of the support surfaces of the pair simultaneously contacts an outer peripheral corner of the body to bear a weight of the electric device and to prevent the electric device from moving in the first direction.

35. The container according to claim 25, wherein the projections of the pair have respective reverse surfaces being opposite to each other in the first direction and extending in the second direction as reverse surfaces relative to the support surfaces of the pair, and the projections of the pair are formed in such a manner that at least one of the reverse surfaces is prevented from contacting the leads when the support surfaces simultaneously contacts the electric device to prevent the electric device from moving in the first direction.

36. A thermoplastic resin tape-shaped carrier container for containing electric devices, comprising:

a plurality of recesses for receiving therein the electric device, including a top opening area for insertion of the electric device therethrough into the recess, and a bottom area; and a pair of projections for restraining a movement of the electric device in a first direction perpendicular to a second direction directed from the top opening area toward the bottom area, wherein the projections of the pair have respective support surfaces facing to each other in the first direction, and a distance between the support surfaces of the pair in the first direction decreases in the second direction in such a manner that each of the support surfaces simultaneously contacts the electric device to prevent the electric device from moving in the first direction, and wherein an angle between the second direction and one of the support surfaces decreases in a fourth direction from the bottom area toward the top opening area.

* * * * *